United States Patent
Chen et al.

(10) Patent No.: US 7,944,251 B2
(45) Date of Patent: May 17, 2011

(54) REDUCED LINE DRIVER OUTPUT DEPENDENCY ON PROCESS, VOLTAGE, AND TEMPERATURE VARIATIONS

(75) Inventors: Andrew Chen, Redondo Beach, CA (US); Joseph Aziz, Irvine, CA (US); Derek Tam, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/381,227

(22) Filed: Mar. 9, 2009

(65) Prior Publication Data
US 2010/0225362 A1 Sep. 9, 2010

(51) Int. Cl.
*H03B 1/00* (2006.01)
(52) U.S. Cl. .................. 327/108; 327/109; 327/512
(58) Field of Classification Search ........... 327/108–112
See application file for complete search history.

(56) References Cited

U.S. PATENT DOCUMENTS

| | | | |
|---|---|---|---|
| 4,656,428 A * | 4/1987 | Ishikawa | 327/106 |
| 4,804,863 A * | 2/1989 | Welland et al. | 327/127 |
| 4,959,616 A * | 9/1990 | Matsumoto | 327/106 |
| 5,196,732 A * | 3/1993 | Takahashi et al. | 327/126 |
| 2006/0139193 A1* | 6/2006 | Morrow et al. | 341/143 |
| 2009/0195319 A1* | 8/2009 | Yazicioglu et al. | 330/296 |

* cited by examiner

*Primary Examiner* — An T Luu
(74) *Attorney, Agent, or Firm* — Farjami & Farjami LLP

(57) ABSTRACT

According to one exemplary embodiment, a transmitter module includes a line drive including a current digital-to-analog converter, where the line driver provides an analog output waveform. The current digital-to-analog converter receives a digitally filtered input waveform including at least two voltage steps. The at least two voltage steps of the digitally filtered input waveform cause a rise time of the analog output waveform to have a reduced dependency on process, voltage, and temperature variations in the line driver, while meeting stringent rise time requirements. The digitally filtered input waveform has an initial voltage level and a final voltage level, where the final voltage level is substantially equal to a sum of the at least two voltage steps of the digitally filtered input waveform.

20 Claims, 4 Drawing Sheets

REDUCED LINE DRIVER OUTPUT DEPENDENCY ON PROCESS, VOLTAGE, AND TEMPERATURE VARIATIONS

BACKGROUND OF THE INVENTION

1. Field of the Invention

The present invention is generally in the field of electrical circuits. More particularly, the invention is in the field of line drivers for transmission lines.

2. Background Art

Line drivers, such as current mode line drivers in transmitter modules, can be utilized in set-top boxes, cable modems, routers, computer interfaces, and other electronic devices to drive transmission lines, such as Ethernet transmission lines. A line driver, such as a current mode line driver, can include a current digital-to-analog converter (IDAC) for receiving a digital input waveform. The line driver can be configured to provide an analog output waveform corresponding to the digital input waveform. However, the analog output waveform can be required to meet stringent rise and fall time specifications, such as the rise and fall time specifications required by, for example, a 100TX Ethernet data transmission standard.

A conventional approach can include providing analog RC filtering in the line driver to achieve an analog output waveform having rise and fall times that meet required specifications. However, process, voltage, and temperature variations in R (resistance) and C (capacitance) values can cause the rise and fall times of the analog output waveform to fail to meet the required specifications. As a result, the conventional approach can require a calibration circuit to provide RC time constant calibration so as to cause the analog output waveform to meet the required rise and fall time specifications. However, the calibration circuit can undesirably increase line driver design complexity and layout area.

SUMMARY OF THE INVENTION

Reduced line driver output dependency on process, voltage, and temperature variations, substantially as shown in and/or described in connection with at least one of the figures, and as set forth more completely in the claims.

DETAILED DESCRIPTION OF THE INVENTION

The present invention is directed to a reduced line driver output dependency on process, voltage, and temperature variations. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
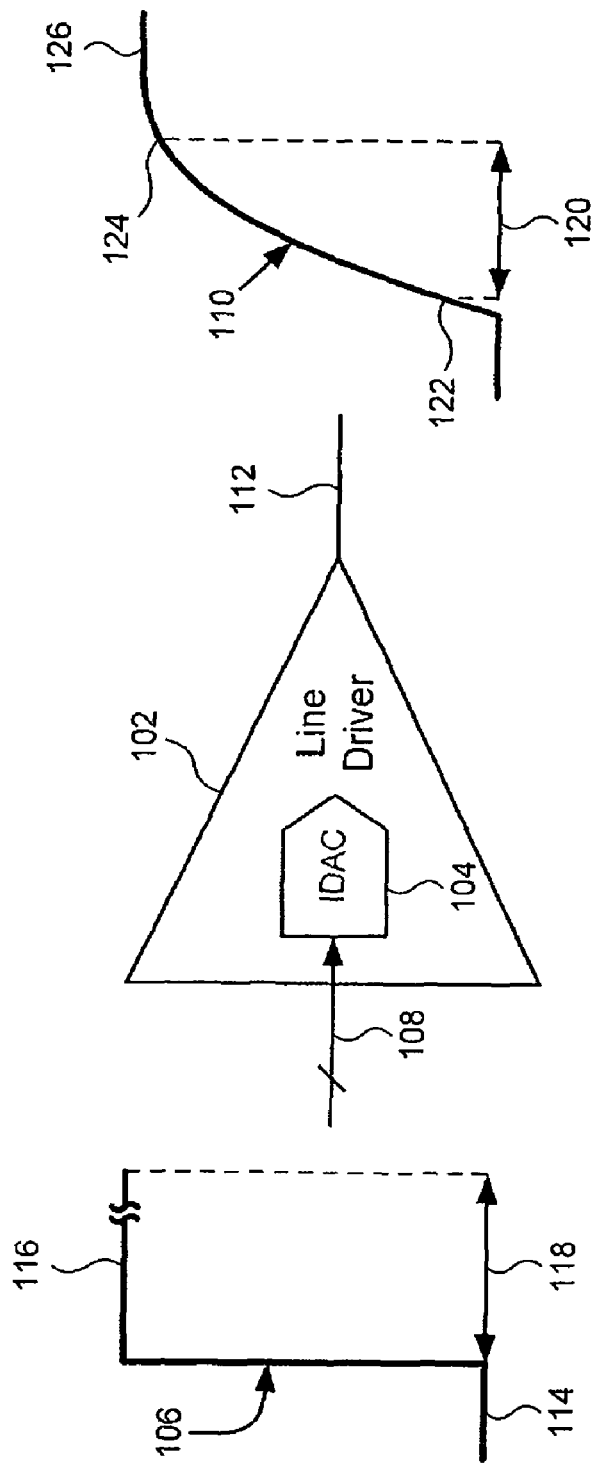
FIG. 1 illustrates a diagram of an exemplary conventional line driver and a conventional exemplary digital input waveform.

FIG. 1 shows a diagram of an exemplary conventional line driver and an exemplary conventional digital input waveform. Conventional line driver 102, which can be a current mode line driver, includes IDAC (current digital-to-analog converter) 104. Conventional line driver 102, which can be a portion of a transmitter module, can be utilized in set-top boxes, cable modems, routers, computers, and other electronic devices to drive transmission lines coupled to the devices. For example, conventional line driver 102 can be utilized in an IC chip with an Ethernet interface, where the Ethernet interface is coupled to an Ethernet transmission line, such as a category (CAT) 5 Ethernet cable. Conventional line driver 102 can be fabricated on a semiconductor die (also referred to as a "chip" or simply as a "die" in the present application).

As shown in FIG. 1, conventional digital input waveform 106, which comprises digital data, is inputted into conventional line driver 102 via input 108 of IDAC 104. IDAC 104 can convert the digital data into an analog signal, which can be amplified by conventional line driver 102 and provided as analog output waveform 110 at output 112. Conventional digital waveform 106 has an abrupt (i.e. a single step) transition from initial voltage level 114, which can represent a digital value of "0", to final voltage level 116, which can represent a digital value of "1". For example, initial voltage level 114, which is a low voltage level, can be equal to approximately 0.0 volts and final voltage level 116, which is a high voltage level, can be equal to approximately 5.0 volts. Conventional digital input waveform 106 has time period 118, which is equal to the reciprocal of the digital data rate. For a digital data rate equal to 125.0 megahertz (MHz), for example, time period 118 can be equal to 8.0 ns. For conventional digital input waveform 106, one digital sample can be provided during time period 118.

Also shown in FIG. 1, analog output waveform 110 has rise time 120, which corresponds to the time required for analog output waveform 110 to rise from voltage level 122 to voltage level 124. Voltage level 122 can be substantially equal to 10.0 percent of voltage level 126, which is a final settled voltage level, and voltage level 124 can be substantially equal to 90.0 percent of voltage level 126. Rise time 120 can be dependent on resistance (R) and capacitance (C) values intrinsic to conventional line driver 102. Rise time 120 can also be dependent on circuit parameters of conventional line driver 102. Analog output waveform 110 also has a fall time (not shown in FIG. 1) corresponding to an abrupt transition from final voltage level 116 to initial voltage level 114 in digital input waveform 106, which can correspond to the time required for analog output waveform 110 to fall from voltage level 126 to voltage level 122. The fall time of analog output waveform 110 can be, for example, substantially equal to rise time 120.

Depending on the particular application, analog output waveform 110 of conventional line driver 102 can be required to meet stringent rise and fall time specifications. For a 100TX Ethernet data transmission standard, for example, analog output waveform 110 can be required to meet a 4.0 ns rise and fall time specification. To meet a stringent rise and fall time specification, such as 4.0 ns, conventional line driver 102 can include internal RC filtering. However, R and C values in conventional line driver 102 can vary by a significant amount over process, voltage, and temperature (PVT) variations, which can undesirably affect the corresponding RC time constant. For example, R and C values can vary by approximately ±15.0 percent over PVT variations, which can cause the corresponding RC time constant to vary by approximately ±30.0 percent. As a result, conventional line driver 102 can include a calibration circuit to provide RC time constant calibration so as to cause the rise and fall times of analog output waveform 110 to meet a time rise and fall time specification, such as 4.0 ns. However, the calibration circuit can undesirably increase design complexity and layout area in conventional line driver 102.

Figure 2:
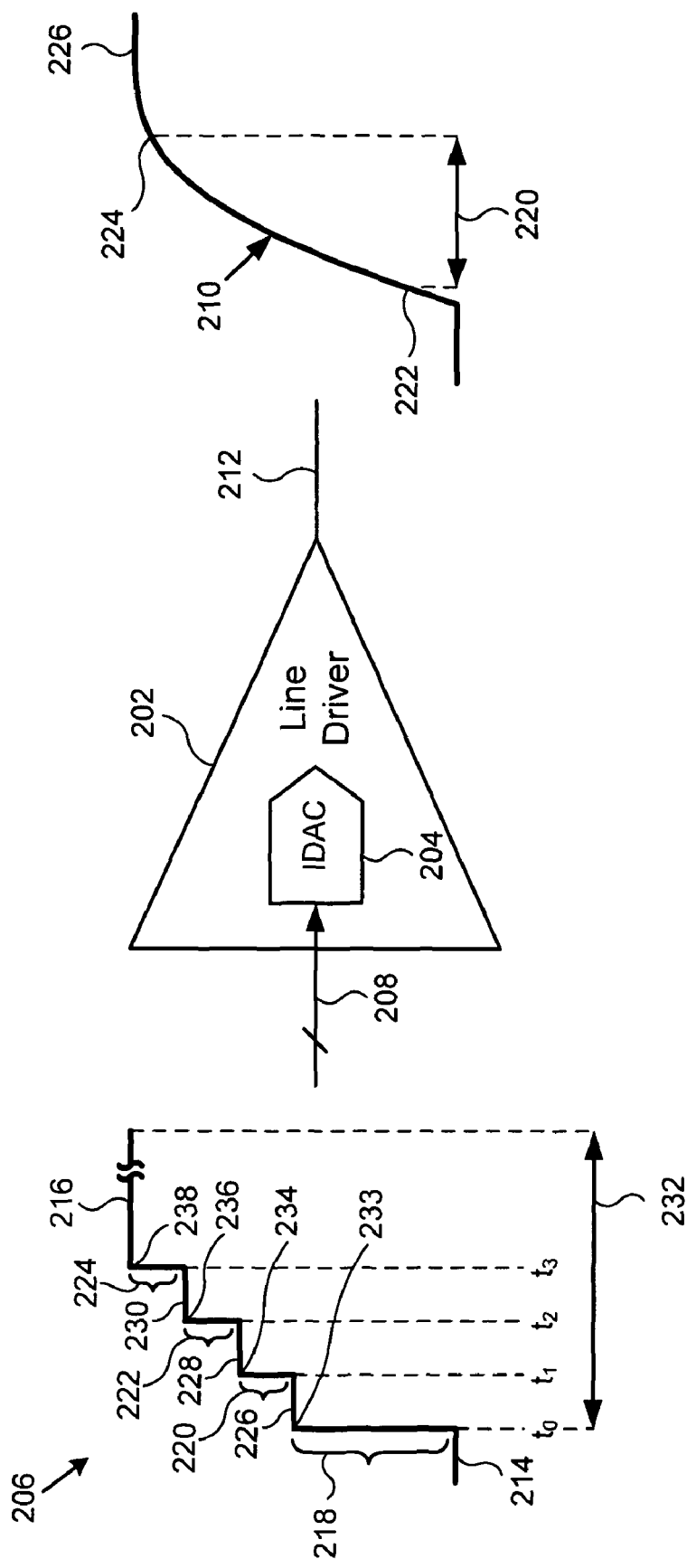
FIG. 2 illustrates a diagram of an exemplary line driver and an exemplary digitally filtered input waveform in accordance with one embodiment of the present invention.

FIG. 2 shows a diagram of an exemplary line driver and an exemplary digitally filtered input waveform in accordance with one embodiment of the present invention. Line driver 202, which can be a current mode line driver, includes IDAC 204. Line driver 202, which can be a portion of a transmitter module, can be utilized in set-top boxes, cable modems, routers, computers, and other electronic devices to drive data on transmission lines, such an Ethernet cables. For example, line driver 202 can be utilized in an IC chip with an Ethernet interface, which can be coupled to an Ethernet transmission line, such as a CAT 5 Ethernet cable or other type of Ethernet cable. A transmitter module including line driver 202 can be fabricated on a semiconductor die.

As shown in FIG. 2, digitally filtered input waveform 206 (also referred to simply as "digital input waveform 206"), which comprises digital data, is inputted into line driver 202 via input 208 of IDAC 204. IDAC 204 can convert the digital data into an analog signal, which can be amplified by line driver 202 and provided as analog output waveform 210 at output 212 of the line driver. Digital input waveform 206 can include voltage steps 218, 220, 222, and 224 to provide a transition from initial voltage level 214, which can be a low voltage level, to final voltage level 216, which can be a high voltage level, where the sum of voltage steps 218, 220, 222, and 224 can be substantially equal to final voltage level 216. As an example, initial voltage level 214 can represent a digital value of "0" and final voltage level 216 can represent a digital value of "1". For example, initial voltage level 214 can be equal to approximately 0.0 volts and final voltage level 216 can be equal to approximately 5.0 volts in one embodiment of the invention. In one embodiment of the invention, a digital input waveform, such as digital input waveform 206, can transition from initial voltage level 214 to final voltage level 216 in at least two voltage steps.

In digital input waveform 206, voltage step 218 provides a transition from initial voltage level 214 to intermediate voltage level 226, voltage step 220 provides a transition from intermediate voltage level 226 to intermediate voltage level 228, voltage step 222 provides a transition from intermediate voltage level 228 to intermediate voltage level 230, and voltage step 224 provides a transition from intermediate voltage level 230 to final voltage level 216. For example, voltage step 218 can be equal to approximately 0.625 of final voltage level 216 and voltage steps 220, 222, and 224 can each be equal to approximately 0.125 of final voltage level 216 in one embodiment. Thus, in one embodiment, voltage step 218 can be greater than each of voltage steps 220, 222, and 224.

Also shown in FIG. 2, voltage steps 218, 220, 222, and 224 can be provided at times $t_0$, $t_1$, $t_2$, and $t_3$, respectively. Voltage steps 218, 220, and 222 can have durations substantially equal to time intervals $t_1-t_0$, $t_2-t_1$, and $t_3-t_2$, respectively. For example, the duration of each of steps 218, 220, and 222 can correspond to one clock cycle of a system clock in one embodiment. For example, each of time intervals $t_1-t_0$, $t_2-t_1$, and $t_3-t_2$ can be substantially equal to 1.0 ns, which can be the time period of the system clock.

However, the number of steps between an initial voltage level and a final voltage level, the voltage level provided by each step, and the duration of each step in the invention's digital input waveform can be programmable and adjustable. Thus, in another embodiment, the invention can provide a digital input waveform that can be programmed such that the number of steps between an initial voltage level and a final voltage level, the voltage level provided by each step, and the duration of each step can be different than in digital input waveform 206.

Digital input waveform 206 can be generated by digital synthesized logic, for example. In one embodiment, digital input waveform 206 can be hard-code in, for example, a read-only memory (ROM). In another embodiment, digital input waveform 206 can be reprogrammable "on the fly." For example, digital input waveform 206 can be controlled under software by on-chip registers, thereby enabling digital input waveform 206 to be changed or reprogrammed as required.

Further shown in FIG. 2, digital input waveform 206 has time period 232, which is equal to the reciprocal of the digital data rate. For a digital data rate equal to 125.0 MHz, for example, time period 232 can be equal to 8.0 ns. For digital input waveform 206, digital samples can be provided at each of times $t_0$, $t_1$, $t_2$, and $t_3$ in time period 232. Thus, for a time period equal to 8.0 ns, an embodiment of the invention's digital input waveform 206 can be digitally sampled at least four times compared to conventional digital wave 102 in FIG. 1, which is only digitally sampled once. As a result of voltage steps 218, 220, 222, and 224, the voltage level and time of occurrence of intermediate points 234, 236, and 238 in digital input waveform 206 can be accurately controlled.

Further shown in FIG. 2, analog output waveform 210 has rise time 240, which corresponds to the time required for analog output waveform 210 to rise from voltage level 242 to voltage level 244. Voltage level 242 can be substantially equal to 10.0 percent of voltage level 246, which is a final settled voltage level of analog waveform 210, and voltage level 244 can be substantially equal to 90.0 percent of voltage level 246. Rise time 240 can be dependent on R and C values intrinsic to line driver 202, which can provide an RC time constant. Rise time 240 can also be dependent on circuit parameters of line driver 202. However, by utilizing digital filtering, voltage steps 218, 220, 222, and 224 are provided in digital input waveform 206, thereby accurately defining respective points 233, 234, 236, and 238 on the digital input waveform with respect to voltage level and time.

Thus, as a result of voltage steps 218, 220, 222, and 224 in digital input waveform 206, analog output waveform 210 at output 212 of line driver 202 can be more accurately controlled, thereby providing increased control of rise time 240 of analog output waveform 210. Consequently, digital input waveform 206 can significantly reduce the dependency of rise time 240 of analog output waveform 210 on PVT (process, voltage, and temperature) variations in line driver 202.

Analog output waveform 210 also has a fall time (not shown in FIG. 2), which can correspond to the time required for analog output waveform 210 to decrease from voltage level 244 to voltage level 242. Although not shown in FIG. 2, digital input waveform 206 can include voltage steps similar to voltage steps 218, 220, 230, and 238 to cause a multiple step decrease from final voltage level 216 to initial voltage level 214 at the falling edge of digital input waveform 206. Thus, in a similar manner as discussed above, digital input waveform 206 can also significantly reduce the dependency of the fall time of analog output waveform 210 on PVT variations in line driver 202. In one embodiment, the fall time of analog output waveform 210 can be substantially equal to rise time 240.

By providing multiple voltage steps in digital input waveform 206 as discussed above, increased control over analog output waveform 210 of line driver 202 is provided by reducing the dependency of rise and fall times of analog output waveform 210 on PVT (process, voltage, and temperature) variations. As a result, analog output waveform 210 can meet stringent rise time specification, such as a 4.0 ns rise time specification required for a 100TX Ethernet transmission standard. Also, the multiple voltage steps provided in digital input waveform 206 enable analog output waveform 210 to meet a stringent rise time specification without requiring a calibration circuit in line driver 202, as required in conventional line driver 102. As a result of an embodiment of the invention's digital input waveform 206, line driver 202 can advantageously avoid the increase design complexity and layout area associated with the calibration circuit. An embodiment of the invention's digital input waveform is further discussed with respect to FIG. 3.

Figure 3:
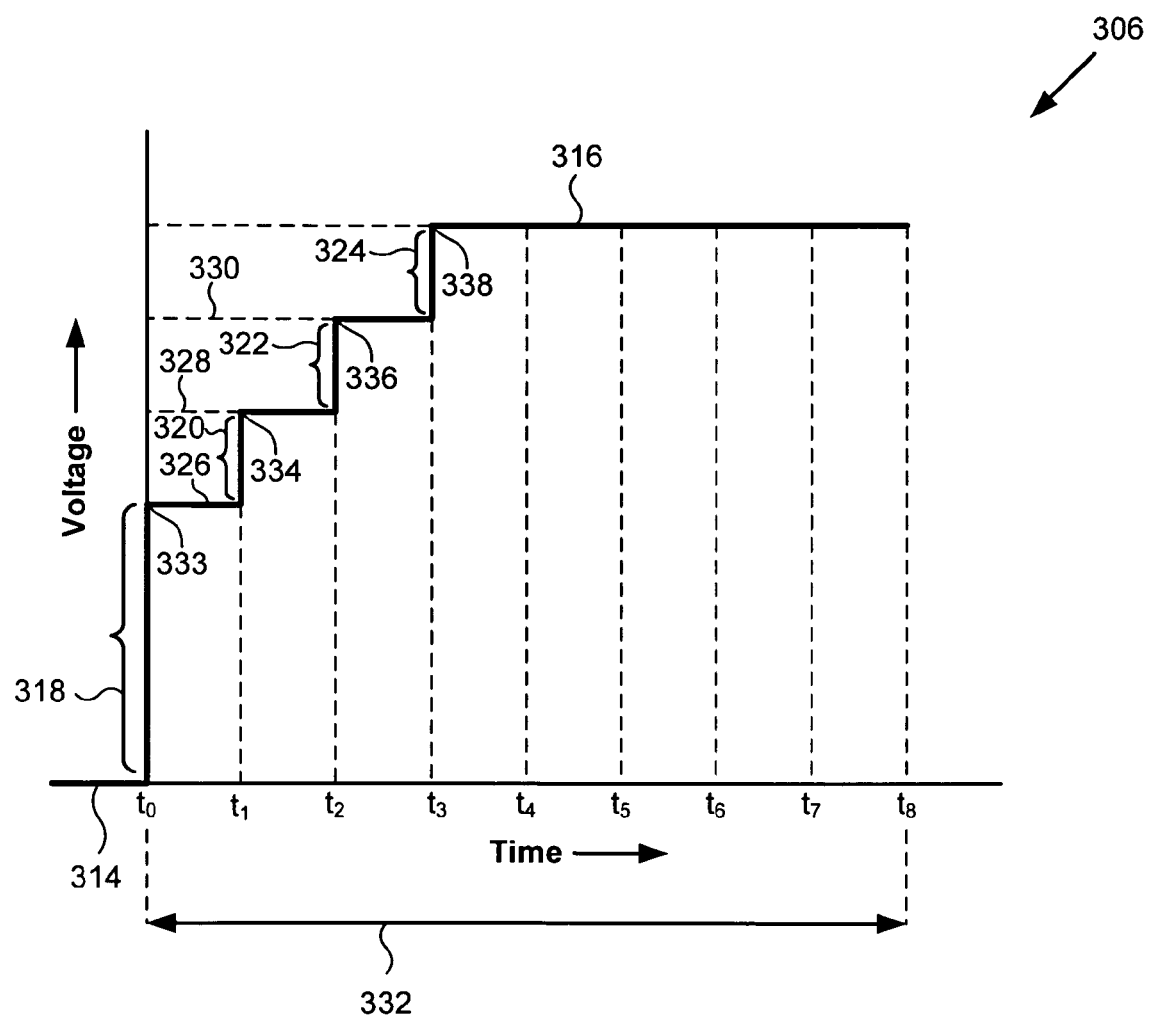
FIG. 3 illustrates a diagram of an exemplary digitally filtered input waveform for a line driver in accordance with one embodiment of the present invention.

FIG. 3 shows a diagram of an exemplary digitally filtered input waveform in accordance with one embodiment of the present invention. In FIG. 3, digitally filtered input waveform 306 (also simply referred to as "digital input waveform 306") corresponds to digital input waveform 206 in FIG. 2. In particular, initial voltage level 314, final voltage level 316, voltage steps 318, 320, 322, and 324, intermediate voltage levels 326, 328, and 330, time period 332, and points 333, 334, 336, and 338 in digital input waveform 306 correspond, respectively, to initial voltage level 214, final voltage level 216, voltage steps 218, 220, 222, and 224, intermediate voltage levels 226, 228, and 230, time period 232, and points 233, 234, 236, and 238 in digital input waveform 206 in FIG. 2.

As shown in FIG. 3, time period 332 extends from time $t_0$ to time $t_8$ and can include time intervals $t_1-t_0, t_2-t_1, \ldots, t_n-t_{n-1}$, where "n" equals eight in one embodiment. In other embodiments, "n" can be greater or less than eight. For a digital data rate equal to 125.0 MHz, for example, time period 332 can be equal to 8.0 ns. In other embodiments, time period 332 can be greater than or less than 8.0 ns. In an embodiment of the invention, one digital sample can be provided in each of time intervals $t_1-t_0, t_2-t_1, \ldots, t_n-t_{n-1}$. In digital input waveform 306, the duration of each time interval (i.e. the duration of each of time intervals $t_1-t_0, t_2-t_1, \ldots, t_n-t_{n-1}$) and the voltage level in each time interval can be programmed or adjusted. In one embodiment, each of time intervals $t_1-t_0, t_2-t_1, \ldots, t_n-t_{n-1}$ can have a substantially equal duration. For example, each of time intervals $t_1-t_0, t_2-t_1, \ldots, t_n-t_{n-1}$ can be substantially equal to 1.0 ns. Also shown in FIG. 3, time intervals $t_1-t_0, t_2-t_1$, and $t_3-t_2$ correspond, respectively, to the durations of voltage steps 318, 320, and 322. The duration of voltage step 324 can correspond to time interval $t_8-t_3$ in an embodiment of the invention.

Thus, as discussed above, an embodiment of the invention's digital input waveform 306 comprises a plurality of voltage steps between an initial voltage level and a final voltage level, where each voltage step can be advantageously programmed and adjusted with respect to voltage level and duration.

Figure 4:
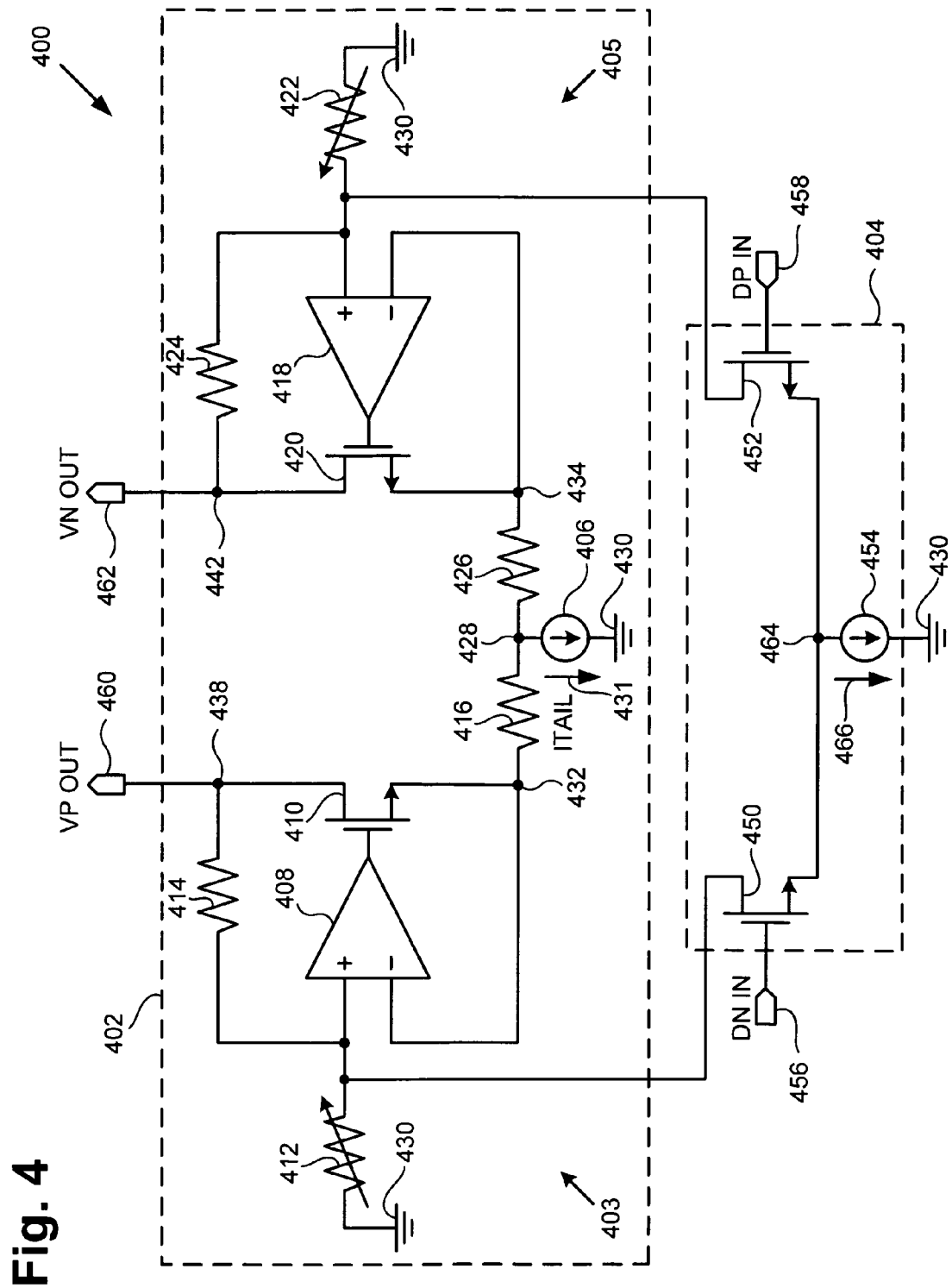
FIG. 4 illustrates a circuit diagram of an exemplary line driver for receiving an exemplary digitally filtered input waveform in accordance with one embodiment of the present invention.

FIG. 4 shows a circuit diagram of an exemplary line driver in accordance with one embodiment of the present invention. Line driver 400 includes active termination circuit 402 and IDAC 404. In FIG. 4, line driver 400 and IDAC 404 can correspond, respectively, to line driver 202 and IDAC 204 in FIG. 2. Active termination circuit 402, which is a differential active termination circuit, includes active termination branches (also referred to simply as "branches") 403 and 405 and current sink 406. Branch 403 includes amplifier 408, transistor 410, feedback resistors 412 and 414, and degeneration resistor 416 and branch 405 includes amplifier 418, transistor 420, feedback resistors 422 and 424, and degeneration resistor 426. In one embodiment, each component in branch 403 is substantially identical to the corresponding component in branch 405. Branch 403 is coupled to branch 405 at node 428 and tail current sink 406 is coupled between node 428 and ground 430. Line driver 400 can be a current-based line driver, such as a current-based Ethernet line driver. Line driver 400 can be utilized, for example, in set-top boxes, cable modems, routers, computers, and other electronic devices to drive data on transmission lines, such an Ethernet cables. For example, line driver 400 can be utilized in an IC chip with an Ethernet interface, which can be coupled to an Ethernet transmission line, such as a CAT 5 Ethernet cable or other type of Ethernet cable.

Line driver 400 can be configured to receive data negative input (DN IN) 456 and data positive input (DP IN) 458 and to provide voltage positive output (VP OUT) 460 and voltage negative output (VN OUT) 462, where VP OUT 460 and VN OUT 462 are differential outputs and DN IN 456 is the complement of DP IN 458. DP IN 458 can comprise an embodiment of the invention's digitally filtered input waveform, such as digital input waveform 206 in FIG. 2, and DN IN 456 can comprise a complement of digital input waveform 206. Thus, if DP IN 458 provides a digital value of "1", DN IN 456 will provide a digital value of "0", and vice versa. Also, data can be inputted into line driver 400 as a multi-bit digital word and its complement, where each bit requires a separate IDAC, such as IDAC 404. Thus, for example, in an embodiment in which a digital word comprising 16 bits is inputted into line driver 400, 16 IDACs, such as IDAC 404, would be coupled to active termination circuit 402, where each IDAC would correspond to one bit of the digital word. In the above example, each IDAC would drive active termination circuit 402 concurrently and the current outputs provided by the IDACs would be summed together.

As shown in FIG. 4, a first terminal of tail current sink 406 is coupled to ground 430 and a second terminal of tail current sink 406 is coupled to first terminals of degeneration resistors 416 and 426 at node 428. Degeneration resistors 416 and 426 can each have resistance equal to, for example, approximately 4.5 ohms in one embodiment. Tail current sink 406 sinks tail current (ITAIL) 431, which is substantially equal to the current flowing through transistors 410 and 420. For a 10BT Ethernet data transmission standard, ITAIL 431 can be, for example, approximately 55.0 mA. For a 100TX Ethernet data transmission standard, ITAIL 431 can be, for example, approximately 25.0 mA.

Also shown in FIG. 4, a second terminal of degeneration resistor 416 is coupled to the source of transistor 410 and the negative (inverting) input of amplifier 408 at node 432, and the second terminal of degeneration resistor 426 is coupled to the source of transistor 420 and the negative (inverting) input of amplifier 418 at node 434. Amplifiers 408 and 418 can each be an operational amplifier, such as a high gain operational amplifier. Transistors 410 and 420 can each be an NFET, for example. In one embodiment, more than one transistor can be utilized in place of each of transistors 410 and 420. Further shown in FIG. 4, a first terminal of feedback resistor 412 is coupled to ground 430 and a second terminal of feedback resistor 412 is coupled to a first terminal of feedback resistor 414 and the positive (non-inverting) input of amplifier 408.

Also shown in FIG. 4, a first terminal of feedback resistor 422 is coupled to ground 430 and a second terminal of feedback resistor 422 is coupled to a first terminal of feedback resistor 424 and the positive (non-inverting) input of amplifier 418. Feedback resistors 412 and 422 can each be an adjustable resistor and can have a resistance equal to, for example, approximately 1.0 kilo-ohm in one embodiment. Feedback resistors 414 and 424 can each have a resistance equal to, for example, at least 10.0 kilo-ohms. Further shown in FIG. 4, the output of amplifier 408 is coupled to the gate of transistor 410 and the drain of transistor 410 is coupled to a second terminal of feedback resistor 414 at node 438. Also shown in FIG. 4, the output of amplifier 418 is coupled to the gate of transistor 420 and the drain of transistor 420 is coupled to a second terminal of feedback resistor 424 at node 442.

Further shown in FIG. 4, a first terminal of tail current sink 454 is coupled to ground 430 and a second terminal of tail current sink 454 is coupled to the sources of transistors 450 and 452 at node 464. Transistors 450 and 452 can each be an NFET, for example. Also shown in FIG. 4, DN IN 456 is coupled to the gate of transistor 450 and the drain of transistor 450 is coupled to the positive (non-inverting) input of amplifier 408. Further shown in FIG. 4, DP IN 458 is coupled to the gate of transistor 452 and the drain of transistor 452 is coupled to the positive (non-inverting) input of amplifier 418. Thus, the current outputs provided by IDAC 404 are coupled to the respective positive inputs of amplifiers 408 and 418 of active termination circuit 402. Current 466, which is the current sunk by IDAC 404, determines the amplitude of the current outputs provided to active termination circuit 402 by IDAC 404.

Line driver 400 can provide an active termination output at nodes 438 and 442. In an Ethernet application, for example, line driver 400 can provide an active termination output of approximately 100.0 ohms across nodes 438 and 442, i.e., across differential outputs VP OUT 460 and VN OUT 462.

By inputting an embodiment of the invention's digitally filtered input waveform, such as digital input waveform 206 in FIG. 2, into IDAC 404, a corresponding analog output waveform can be provided by line driver 400 at node 438 (or at node 442), where the analog output waveform has a rise time (or a fall time) with reduced dependency on process, voltage, and temperature variations.

Thus, as discussed above, the present invention utilizes a digitally filtered input waveform having multiple voltage steps between an initial voltage level and a final voltage level. According to the present invention, the digitally filtered input waveform is inputted into an IDAC in a line driver so as to provide a corresponding analog output waveform, where the digitally filtered input waveform can advantageously cause the analog output waveform to have reduced dependency on process, voltage, and temperature variations in the line driver. For example, the invention's digitally filtered input waveform can cause a rise time of the analog output waveform of the line driver to have reduced dependency on process, voltage, and temperature variations, thereby enabling the analog output waveform to meet a stringent rise time specification. Furthermore, the invention's digitally filtered input waveform can cause the analog output waveform to have a reduced dependency on process, voltage, and temperature variations without requiring a calibration circuit, which can be required in a conventional line driver to meet a stringent rise time specification. As a result, the invention reduces design complexity and layer area associated with the calibration circuit.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A transmitter module comprising:
    a line driver including a current digital-to-analog converter and a termination circuit, said line driver providing an analog output waveform;
    said current digital-to-analog converter receiving a digitally filtered input waveform comprising at least two voltage steps;
    said digitally filtered input waveform causing a rise time of said analog output waveform to have a reduced dependency on process, voltage, and temperature variations in said line driver.

2. The transmitter module of claim 1, wherein said digitally filtered input waveform has an initial voltage level and a final voltage level, and wherein said final voltage level is substantially equal to a sum of said at least two voltage steps.

3. The transmitter module of claim 1, wherein a first of said at least two voltage steps is greater than a second of said at least two voltage steps.

4. The transmitter module of claim 1, wherein said digitally filtered input waveform has a time period comprising a plurality of time intervals, and wherein each of said at least two voltage steps occurs in one of said plurality of time intervals.

5. The transmitter module of claim 4, wherein each of said plurality of time intervals has a substantially equal duration.

6. The transmitter module of claim 1, wherein each of said at least two voltage steps has a substantially equal duration.

7. The transmitter module of claim 4, wherein each of said at least two voltage steps has a duration substantially equal to a corresponding time interval in said plurality of time intervals.

8. The transmitter module of claim 2, wherein said initial voltage level represents a digital value of "0" and said final voltage level represents a digital value of "1".

9. The transmitter module of claim 4, wherein each of said plurality of time intervals corresponds to one clock cycle of a system clock.

10. The transmitter module of claim 2, wherein said digitally filtered input waveform includes at least two intermediate voltage levels between said initial voltage level and said final voltage level, and wherein each of said at least two intermediate voltage levels corresponds to one of said at least two voltage steps.

11. A method for causing a rise time of an analog waveform outputted by a line driver to have a reduced dependency on process, voltage, and temperature variations, said line driver including a current digital-to-analog converter and a termination circuit, said method comprising:
    inputting a digitally filtered waveform into said current digital-to-analog converter, said digitally filtered waveform comprising at least two voltage steps;
    outputting said analog waveform by said line driver, said analog waveform corresponding to said digitally filtered waveform;
    wherein said at least two voltage steps of said digitally filtered waveform cause said rise time of said analog waveform to have said reduced dependency on process, voltage, and temperature variations in said line driver.

12. The method of claim 11, wherein said digitally filtered waveform has an initial voltage level and a final voltage level, and wherein said final voltage level is substantial equal to a sum of said at least two voltage steps.

13. The method of claim 11, wherein a first of said at least two voltage steps is greater than a second of said at least two voltage steps.

14. The method of claim 11, wherein said digitally filtered waveform has a time period comprising a plurality of time intervals, and wherein each of said at least two voltage steps occurs in one of said plurality of time intervals.

15. The method of claim 14, wherein each of said plurality of time intervals has a substantially equal duration.

16. The method of claim 11, wherein each of said at least two voltage steps has a substantially equal duration.

17. The method of claim 14, wherein each of said at least two voltage steps has a duration substantially equal to a corresponding time interval in said plurality of time intervals.

18. The method of claim 12, wherein said initial voltage level represents a digital value of "0" and said final voltage level represents a digital value of "1".

19. The method of claim 14, wherein each of said plurality of time intervals corresponds to one clock cycle of a system clock.

20. The method of claim 12, wherein said digitally filtered waveform includes at least two intermediate voltage levels between said initial voltage level and said final voltage level, and wherein each of said at least two intermediate voltage levels corresponds to one of said at least two voltage steps.

* * * * *